US009198305B2

(12) United States Patent
Smith

(10) Patent No.: US 9,198,305 B2
(45) Date of Patent: Nov. 24, 2015

(54) SOUND ENHANCING CASE FOR ELECTRONIC MEDIA DEVICES

(71) Applicant: Anthony N. Smith, Costa Mesa, CA (US)

(72) Inventor: Anthony N. Smith, Costa Mesa, CA (US)

( * ) Notice: Subject to any disclaimer, the term of this patent is extended or adjusted under 35 U.S.C. 154(b) by 0 days.

(21) Appl. No.: 14/458,056

(22) Filed: Aug. 12, 2014

(65) Prior Publication Data

US 2015/0041245 A1 Feb. 12, 2015

Related U.S. Application Data

(60) Provisional application No. 61/864,834, filed on Aug. 12, 2013.

(51) Int. Cl.
*G10K 11/26* (2006.01)
*H05K 5/00* (2006.01)
*H05K 5/02* (2006.01)
*G10K 11/28* (2006.01)

(52) U.S. Cl.
CPC .............. *H05K 5/0004* (2013.01); *G10K 11/28* (2013.01); *H05K 5/0086* (2013.01); *H05K 5/0217* (2013.01)

(58) Field of Classification Search
CPC . H05K 5/0004; H05K 5/0013; H05K 5/0226; G10K 11/28; G10K 11/26; G10K 11/08; A45C 2011/002
USPC .......................... 181/175, 178, 191, 199, 202; 379/433.13
See application file for complete search history.

(56) References Cited

U.S. PATENT DOCUMENTS

| 4,936,530 A | 6/1990 | Wollar |
| 7,197,140 B2 * | 3/2007 | Asaro ..................... 379/433.03 |
| D609,463 S | 2/2010 | Bullen |
| 8,028,794 B1 | 10/2011 | Freeman |
| 8,086,285 B2 | 12/2011 | McNamara et al. |
| D653,660 S | 2/2012 | Sweet |
| D671,493 S | 11/2012 | Hasbrook et al. |
| 8,433,377 B1 * | 4/2013 | Oh et al. .................... 455/575.1 |
| 8,700,107 B1 * | 4/2014 | Oh et al. .................... 455/575.1 |
| 8,767,992 B2 | 7/2014 | Lester, Jr. |
| 2005/0181745 A1 | 8/2005 | Wood et al. |
| 2005/0255895 A1 | 11/2005 | Lee et al. |
| 2009/0036174 A1 | 2/2009 | Brandenburg et al. |
| 2010/0059649 A1 | 3/2010 | Buxton |
| 2010/0124040 A1 | 5/2010 | Diebel et al. |
| 2011/0259664 A1 | 10/2011 | Freeman |
| 2012/0024619 A1 | 2/2012 | Lin |
| 2012/0241247 A1 | 9/2012 | Choe |
| 2013/0045782 A1 | 2/2013 | Simmer |
| 2013/0048413 A1 | 2/2013 | Patzer |
| 2013/0170686 A1 | 7/2013 | Lester, Jr. |
| 2013/0301863 A1 | 11/2013 | Weaver, III |

FOREIGN PATENT DOCUMENTS

| GB | 2508566 | 6/2014 |
| KR | 1020130114447 | 10/2013 |
| WO | 2013/028282 | 2/2013 |

* cited by examiner

*Primary Examiner* — Jeremy Luks
(74) *Attorney, Agent, or Firm* — Fish & Tsang LLP

(57) ABSTRACT

A protective case for a portable electronic media device has been described. The case includes a rotatable member that transitions from a stowed position to an open position. In the open position the rotatable member is positioned in front of a speaker of the portable electronic media device such that it redirects sound waves emitted from the speaker towards the user.

14 Claims, 13 Drawing Sheets

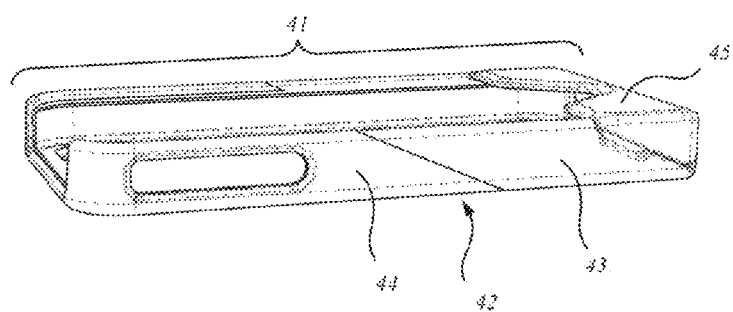
FIG. 15
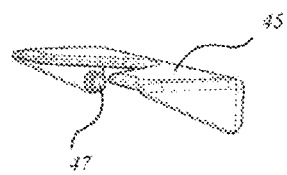
FIG. 16
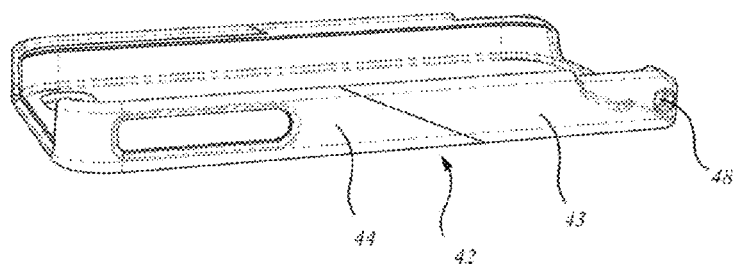

SOUND ENHANCING CASE FOR ELECTRONIC MEDIA DEVICES

This application claims priority to U.S. provisional application 61/864834 filed Aug. 12, 2013. U.S. provisional application 61/864834 and all other extrinsic references contained herein are incorporated by reference in their entirety.

FIELD OF THE INVENTION

The field of the invention is sound enhancing cases for electronic media devices.

BACKGROUND

The background description includes information that may be useful in understanding the present invention. It is not an admission that any of the information provided herein is prior art or relevant to the presently claimed invention, or that any publication specifically or implicitly referenced is prior art.

The field of portable electronic devices, such as portable music players, cellular phones and tablet computers, has seen many advancements, one of which being the incorporation of built-in speakers. Built-in speakers provide a means to emit sound without the use of auxiliary speakers or headphones.

The sound emitted from these speakers, as with all wave-producing audio transducers, has a direction. The direction of the emitted sound is mostly normal to the radiating surface of the audio transducer. This direction of the emitted sound relative to a listener is detected by the human auditory system of the listener in terms of volume and clarity. Sounds emitted in any direction other than along a vector substantially toward the intended listener will be received with reduced volume levels and interaural differences than sound emitted along a vector directly toward the listener. In other words, sound emitted in a direction not toward the intended listener will suffer reduction in sound levels.

With aesthetics, packaging, and design dictating the position of the speakers, many such devices at the present time have speakers positioned such that they do not emit sound waves towards the user when the user is viewing content on the device's screen. For example, when the speakers are located on the side or back of the device, sound is emitted in a direction substantially away from the intended listener. It would be advantageous to redirect the sound from the speakers towards the user to increase volume.

It is common to see people correcting this significant problem in various ways, including the cupping of one hand at the end of the phone and/or tilting the device to face the speaker towards the user's ear. Both methods substantially correct the insufficient sound quality, but degrade the user experience with the electronic device.

Various sound enhancing cases for electronic media devices have been designed to address this problem. U.S. Pat. No. 8,086,285 to McNamara and U.S. Pat. Application No. 2013/0048413 to Patzer, for example, both describe a protective case for mobile phones that has an extendible sound reflector. The reflector is shaped with a bend that helps direct the sound towards the user when extended. While advantageous in some aspects, the angle/bend of the reflector is not adjustable and therefore fails to provide a means for re-directing the sound in different directions. In addition, the sliding sound reflector is cumbersome to use and complicates manufacturing.

U.S. Pat. No. 8,028,794 to Freeman describes a two-piece protective case for an electronic device. The two pieces slide with respect to one another in different fixed positions. When the pieces are separated, the bottom piece redirects sound waves towards the user. Unfortunately, this approach also fails to provide a means for re-directing the sound in different directions.

U.S. Pat. Application No. 2013/0170686 to Lester describes a protective case that has a rotatable sound boosting attachment. The attachment redirects sound toward the user and can be rotated to adjust the angle of redirection. Unfortunately, the boosting attachment is bulky and adds significantly to the length of the electronic device. In addition, the angle of redirection can only be rotated/adjusted in a plane that is perpendicular to the length of the electronic device (e.g., upward and downward relative to the user when the device is used in a landscape orientation).

Other examples of protective cases for electronic devices that enhance and/or redirect sound can be found in U.S. Pat. Application Nos. 2013/0045782, 2013/0301863, 2012/0241247, U.S Pat. No. D671493, and Great Brittan Pat. No. GB 2,508,566. Unfortunately, these references fail to address all of the issues discussed above.

Thus, there is still a need for an improved protective case for electronic devices that enhances sound quality.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

SUMMARY OF THE INVENTION

The inventive subject matter provides apparatus, systems, and methods in which a protective case for a portable electronic media device intercepts and redirects emitted sound from the media device in a direction that enhances sound quality. The protective case comprises of a main protective member and a repositionable second member coupled with the main protective member. The second member is transitionable between two positions: a stowed position and an open position that intercepts and redirects the sound waves emitted from the media device. In the open position the second member is positioned such that one of its major surfaces intercepts and redirects the sound waves emitted from the electronic media device towards the intended viewing position (e.g., towards a user). The open position thus enhances the sound quality of the media device by increasing the volume of the device as perceived by a user. In the stow position the second member covers the front face of the electronic device and is out of the pathway of the sound waves. The stow position serves to protect the front face of the electronic device when the volume boost is not needed.

In one aspect of some embodiments, the second member is pivotably coupled with the first member.

Various objects, features, aspects and advantages of the inventive subject matter will become more apparent from the following detailed description of preferred embodiments, along with the accompanying drawing figures in which like numerals represent like components.

BRIEF DESCRIPTION OF DRAWINGS

FIG. 15 is perspective view of the protective case of FIG. 6, with the sound deflecting second member in a closed position.

FIG. 16 is a perspective view of the protective case of FIG. 6, with the sound deflecting second member decoupled from, and raised above, the first member.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

Figure 1:
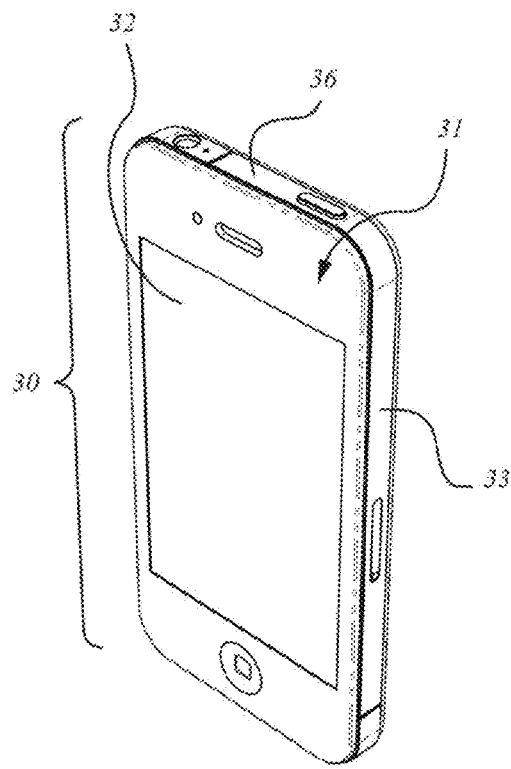
FIG. 1 is a front perspective view of one embodiment of a portable electronic media device.
Figure 2:
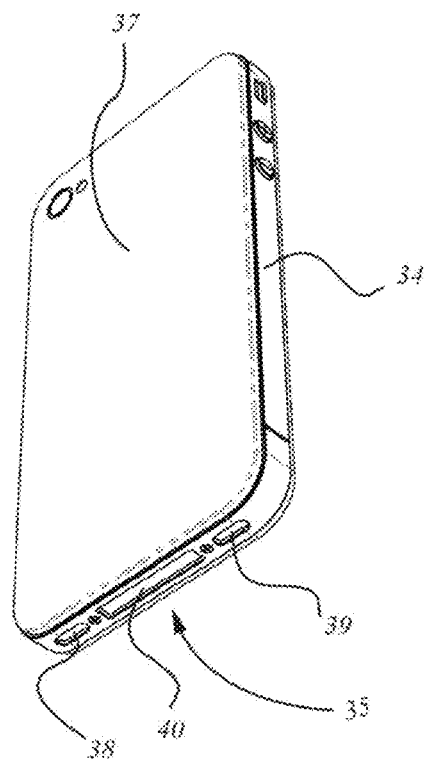
FIG. 2 is a back perspective view of the portable electronic media device of FIG. 1.

Referring first to FIGS. 1 and 2, there is shown a portable electronic media device 30, having a front wall 31 with a screen 32, a first side wall 33 coupled with the front wall 31, a second side wall 34 coupled with the front wall 31, a lower wall 35 coupled with the front wall 31, an upper wall 36 coupled with the front wall 31, a back wall 37 opposite to that of the front wall 31, and typically with one or more speakers, microphones, or audio transducers 38 and 39, located along the lower wall 35.

Figure 3:
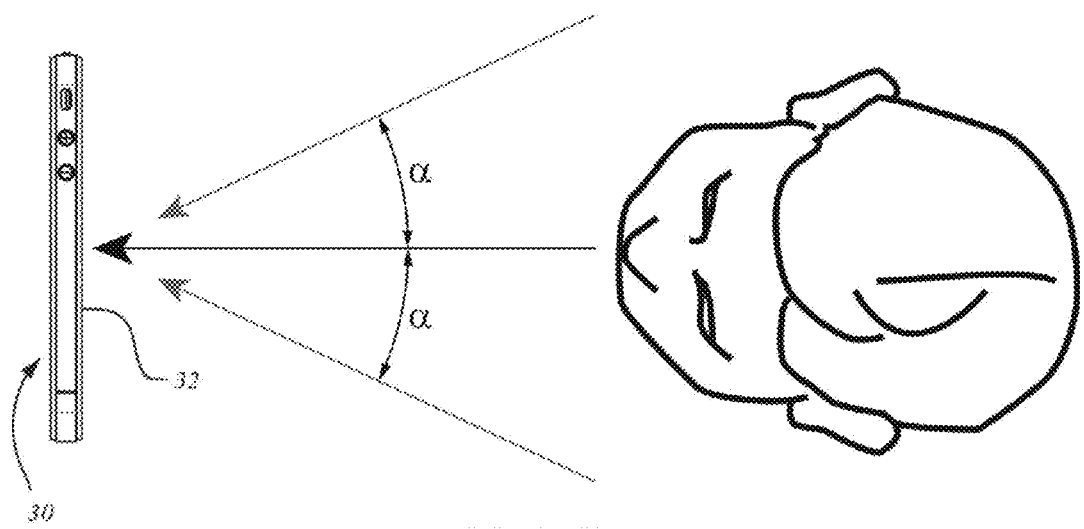
FIG. 3 is a top elevated view of the portable electronic media device of FIG. 1, depicting user viewing angles.
Figure 4:
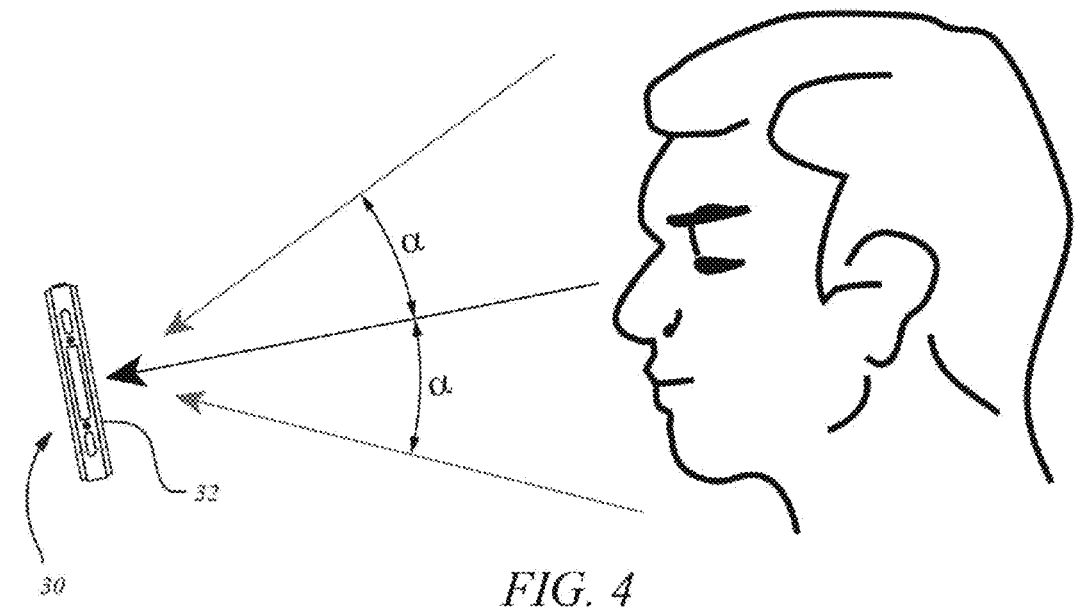
FIG. 4 is a side view of the portable electronic media device of FIG. 1, depicting user viewing angles.

FIGS. 3 and 4 illustrate the intended viewing location and viewing angle when using the portable electronic media device 30 shown in FIGS. 1 and 2. As used herein, the term "viewing angle" means the position of a user when viewing content on the electronic device's display. A viewing location generally means in front of, and substantially normal with, the display. However, it is also contemplated that the viewing angle can be slightly to the side of, and at an angle with, the display. As used herein, the term "substantially normal" means 90 degrees plus or minus 30 degrees (i.e., viewing angle is between 60 and 120 degrees). The viewing angle is the angle between a vector that is normal to screen 32 and the viewer's line of sight.

Figure 5:
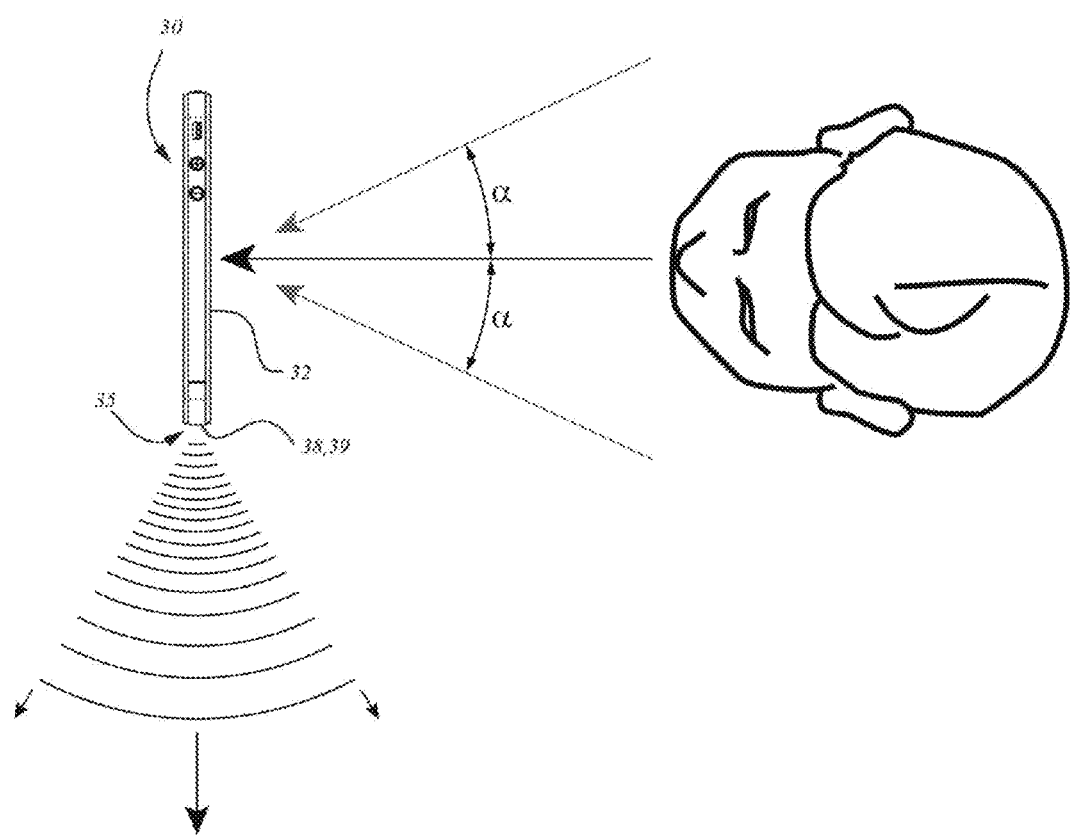
FIG. 5 is a top view of the portable electronic media device of FIG. 1, depicting the direction of emitted sound with respect to user viewing angles.

FIG. 5 shows a top view of the device 30 and an intended listener, depicting emitted sound direction with respect to viewing angles. With the audio transducers 38 and 39 located along the lower wall 35, as depicted in FIG. 2, the media device 30 emits sound along a vector generally normal to the lower wall 35. The intensity (e.g., volume) of the emitted sound diminishes from the viewer's perspective, as the angle between the sound direction and the viewer's line of sight increases (e.g., as the viewer departs from this sound vector). The projected sound from the audio transducers 38 and 39 is thus directed away from the intended viewing position and therefore degrades the audio experience when viewing the screen 32 of the media device 30. A deflection of this emitted sound (e.g., a redirection of the sound vector) toward the intended viewing position will enhance the audio experience of the viewer.

FIGS. 6 through 9 introduce an embodiment of the present invention, a protective case 41 for the electronic media device 30 that can also deflect the emitted sound toward the intended viewing position when needed. The protective case 41 comprises two members; a first member 42 configured to non-permanently attach to the media device 30, and a second member 45 that repositionably couples with the first member 42. The second member 45 can be positioned in a stowed position (e.g., a closed position or "first position") wherein no surface of the second member impedes with the emitted sound of the audio transducers 38 and 39. The second member 45 can also be positioned in a deflection position (e.g., an opened position or "second position") to intercept and deflect the emitted sound of the media device 30 toward the intended viewing position, when desirable.

Figure 6:
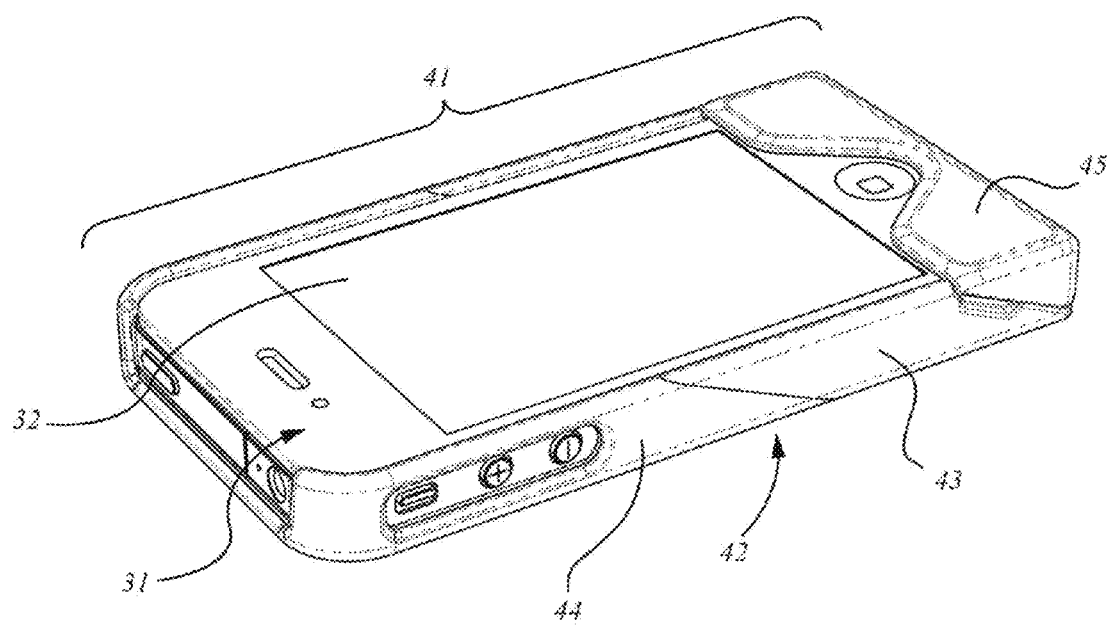
FIG. 6 is an upper left perspective view of the portable electronic device of FIG. 1 housed in a protective case, showing the repositionable sound deflecting member in the stowed position.
Figure 7:
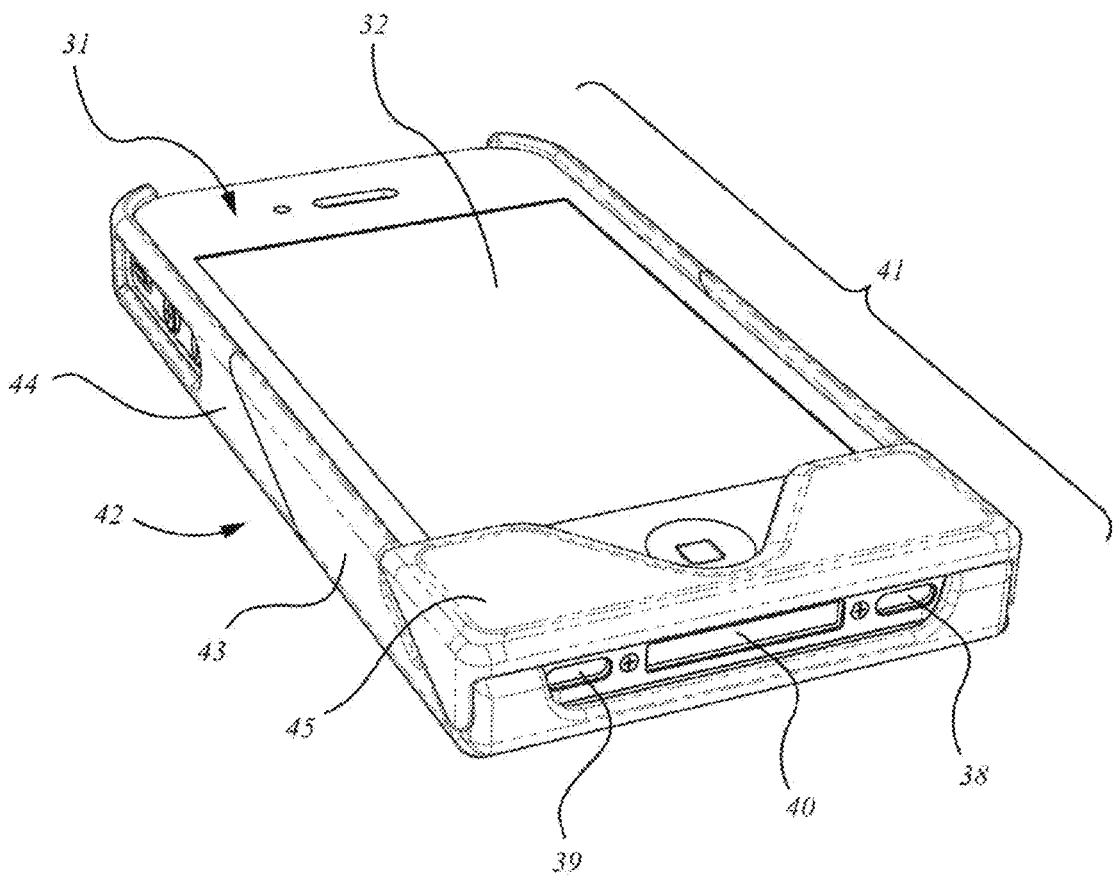
FIG. 7 is a lower left perspective view of FIG. 6 parts, showing the repositionable sound deflecting member in the stowed position.

FIGS. 6 and 7 show the protective case 41 with the sound-deflecting second member 45 in the stow position. In the stow position the sound-deflecting second member 45 rests against a bottom portion of the front wall 31, which helps protect front wall 31 and allows for compact and ergonomic portability. The stow position of the second member 45 is sized, dimensioned, and shaped to allow for access to other various parts of the media device 30 that may be positioned along the lower wall 35 (e.g., audio output ports, charging ports, etc.). The repositionability of the second member 45 allows for convenience of use while still enhancing functionality. While the second member 45 can be designed in various shapes and sizes, the embodiment of the protective case 41 shows a geometry that does not impede access to either the screen 32 of the media device 30 or any functional interfaces while in the stow position. The second member 45 also serves to protect the covered portion of the front wall 31 of the media device 30, while in the stow position. And again, while the second member 45 can be designed in various shapes and sizes, the embodiment of the protective case 41 shows a recess in the surface of the first member 42 where it meets the leading edge of the second member 45 along the side walls, providing ergonomic grip points to reposition the second member 45 from the stow position.

The first member 42 can be made of multiple materials based upon localized functionality. For example, the first member 42 could comprise an elastomeric material in the area 43 that attaches to the second member 45. This allows for desirable functionality at the coupling point between the first member 42 and the second member 45. Area 44 could be made of a harder material to provide protection.

Figure 8:
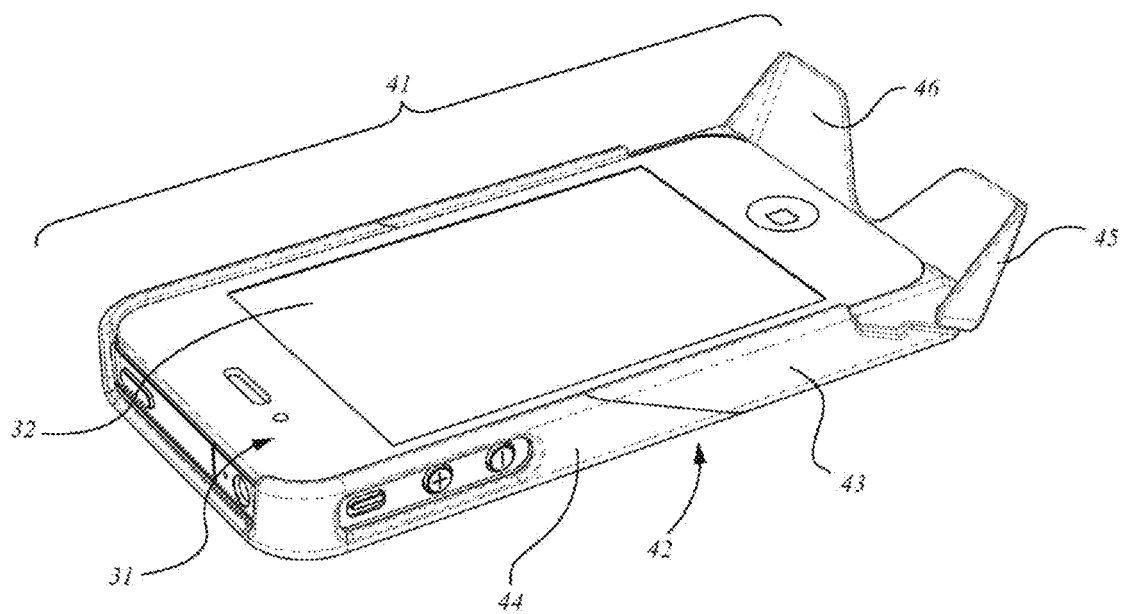
FIG. 8 is an upper left perspective view of FIG. 6 parts, showing the repositionable sound deflecting member in an open position.
Figure 9:
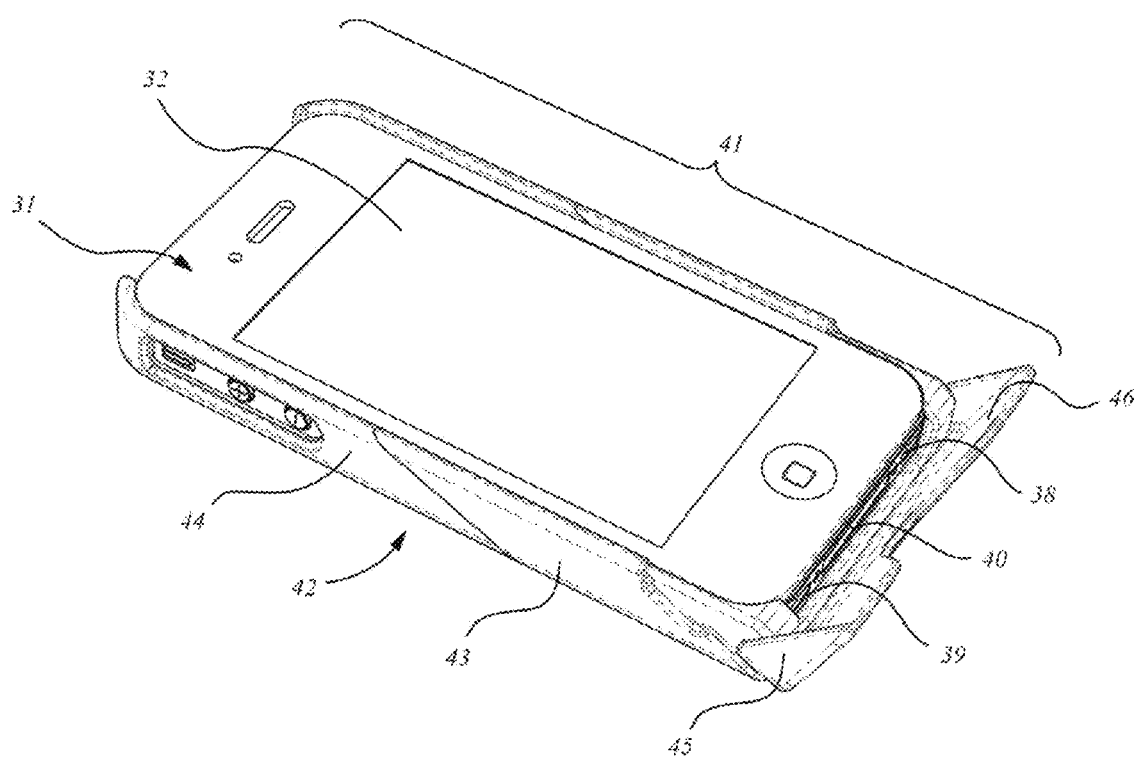
FIG. 9 is a lower left perspective view of FIG. 6 parts, showing the repositionable sound deflecting member in an open position.

FIGS. 8 and 9 show the protective case 41 with the sound-deflecting second member 45 in the second position (e.g., the open position, the deflecting position), positioned to deflect the emitted sound from the audio transducers of the media device toward the intended viewing position. While the second member 45 can be designed in various shapes and sizes, the embodiment of the protective case 41 has a re-directing surface 46 with a surface area that is larger than a surface area of the radiating surface within the audio transducer. It can also be seen that a re-directing surface 46 of the second member 45 that is substantially planar will stow compact against front wall 31 of the media device 30 and still deflect well while in the second position (e.g., the deflecting position). And again, while the second member 45 can be designed in various shapes and sizes, it is preferably shaped to maximize the deflecting characteristics of the re-directing surface 46 while avoiding obstruction to the screen 32 and/or user interfaces along the front wall 31 of the media device 30.

The audio transducers 38 and 39 shown in FIG. 9 can be either speakers, microphones, or both. In the case of speakers, the enhancement will be in the amplification of the perceived sound emitted from the speakers 38 and/or 39 toward the viewing position. In the case of a microphone 38 and/or 39, the enhancement will be in the amplification of the received sound from the viewing position. This will improve the audio experience during video conferencing on such enabled devices. This will also improve speaker phone functionality, both projecting the emitted sound from the speakers 38 and/or 39, and also amplifying the sound pick-up of the microphone 38 or 39.

Figure 10:
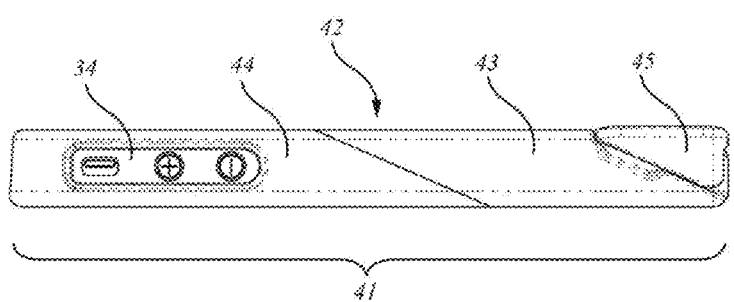
FIG. 10 is a side view of FIG. 6 parts, showing the repositionable sound deflecting member in the stowed position.
Figure 11:
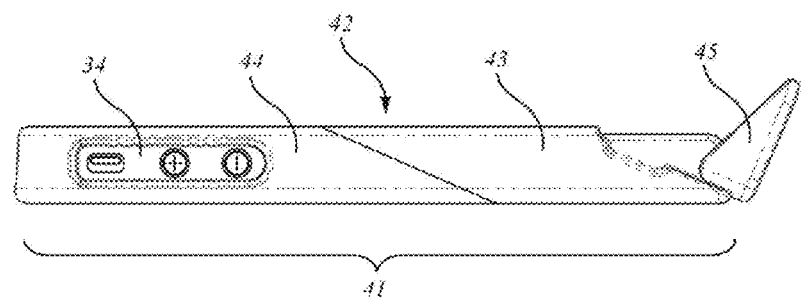
FIG. 11 is a side view of FIG. 6 parts, showing the repositionable sound deflecting member in an open position.

FIGS. 10 and 11 show side views of the protective case 41, depicting the repositionability of the second member 45. The coupling between the first member 42 and the second member 45 pivot the second member about a fixed axis. Though various angular positions of the second member 45 may enhance the audio experience, the preferred angles would be between 90 and 150 degrees.

Figure 12:
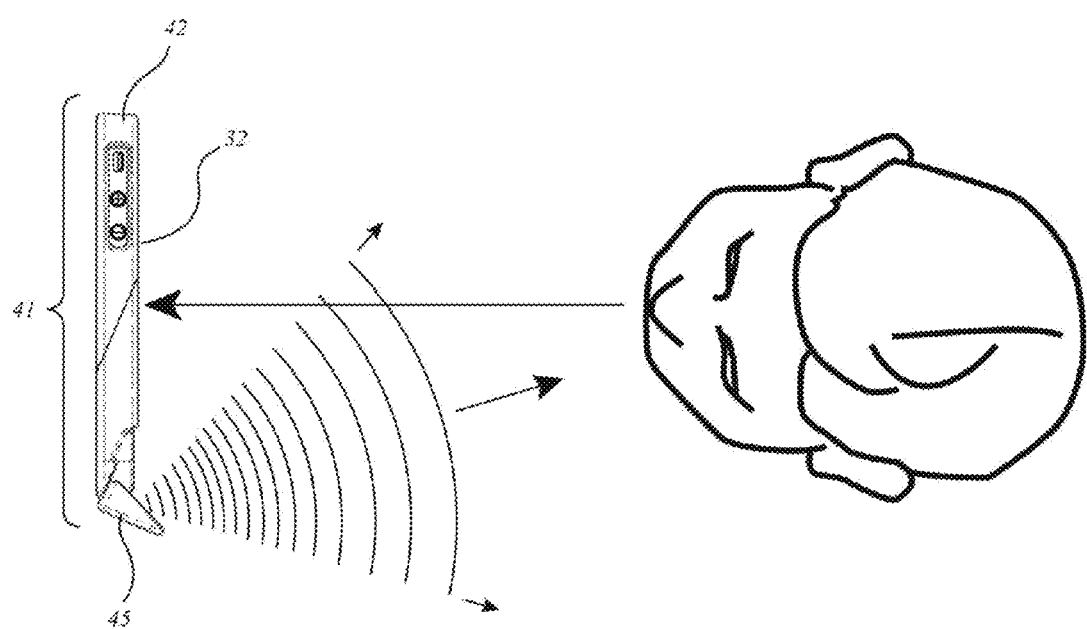
FIG. 12 is a top view of FIG. 6 parts, depicting the redirection of emitted sound waves of the device toward the intended viewing location when the repositionable sound deflecting member is in an open position.

FIG. 12 shows the second member 45 of the protective case 41 in the opened position deflecting and redirecting the emitted sound of the media device 30 toward the viewing position. The opening angle of the second member 45 is positioned to maximize audio experience by both amplifying the sound and correcting the perceived origin of the sound. The opening angle of the second member 45 can be adjusted in a plane that is parallel to the length of the screen 32. This allows the user to direct the sound to the left or right of the screen 32 when viewed in landscape mode (e.g., up or down in the portrait mode). This is helpful when the user's viewing position is not exactly perpendicular to the screen 32, or when there is a second user whose viewing location is offset from the perpendicular vector of the screen 32. Repositioning the second member 45 back to the first position (e.g., the stow position) allows for the original sound direction, as shown in FIG. 5.

Figure 13:
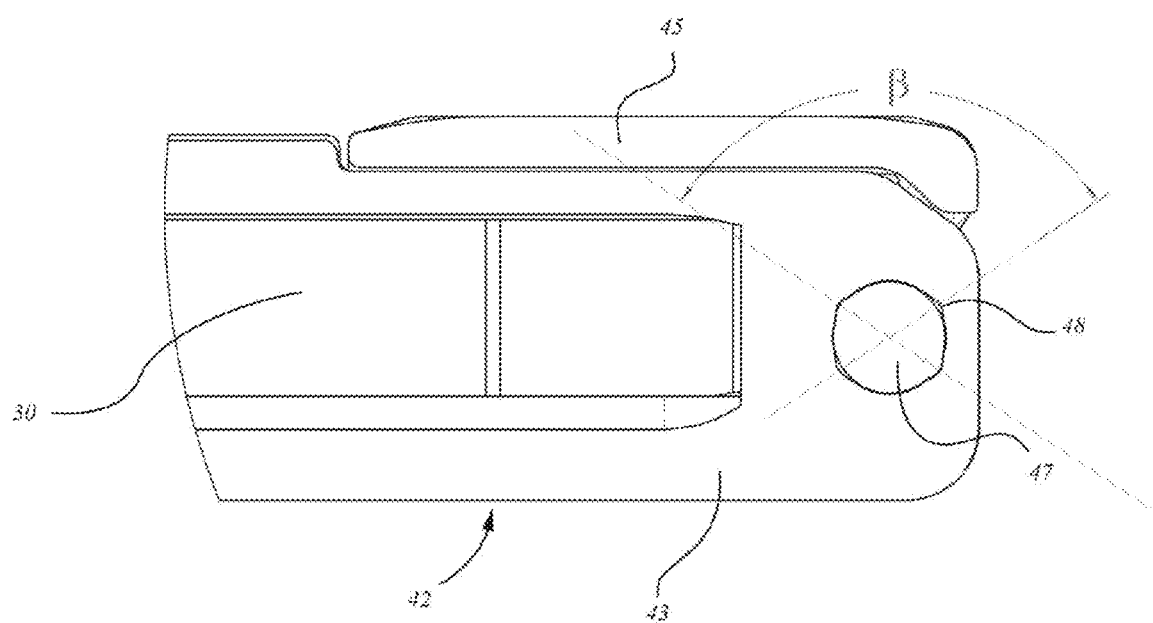
FIG. 13 is a side cross-sectional view of FIG. 6 parts, showing detail of the coupling between the protective case first member and the repositionable sound deflecting second member, in the stowed position.
Figure 14:
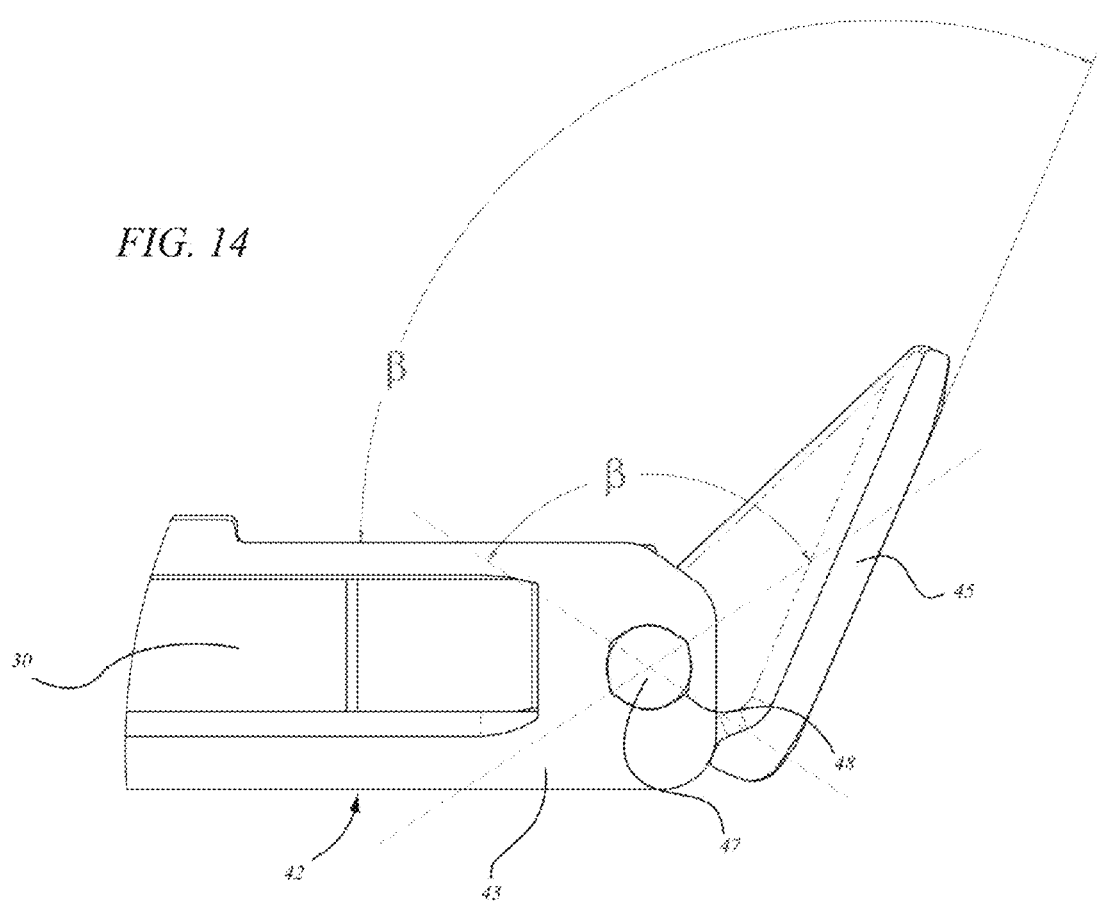
FIG. 14 is a side cross-sectional view of FIG. 6 parts, showing detail of the coupling between the protective case first member and the repositionable sound deflecting second member, in the open position.

FIGS. 13 and 14 show cross-sections of the preferred coupling between the first member 42 and the second member 45. In particular, FIGS. 13 and 14 show the coupling portion 43 of the first member 42 and detailed parts of the second member 45. The first member 42 includes first and second openings 48 along the fixed axis (one opening on each side of the first member 42), and the second member 45 includes first and second protrusions 47 along the fixed axis (one on each side of second member 45), wherein the protrusions 47 of the second member 45 nest within the openings 48 of the first member. The section view only shows one of each, as the section is cut through at one end of the pivot axis.

While the coupling protrusions 47 and openings 48 can designed in various shapes and sizes, the present embodiment is substantially circular with carefully positioned lobes and corresponding divots to positively position the second member in desired locations. An elastomeric coupling portion 43 of the first member 42 will allow the lobes of the protrusions 47 to pivot through the circular portion of the openings, stretching the elastomeric material until it finds the next positioning divot. In alternative embodiments, protrusions 47 could have additional lobes and openings 48 could have additional divots that correspond to the additional lobes, to provide additional opened positions at different angles. The additional opened positions (e.g., second, third, fourth positions) allow for sound to be directed to different viewing locations. In yet other alternative embodiments, protrusions 47 and openings 48 are sized and dimensioned to create a press fit coupling. The friction of the press fit preferably allows second member 45 to be held in, and smoothly/continuously rotate through, a range of opened positions, thus providing even greater adjustability of the redirection angle.

Comparing FIGS. 13 and 14, it can be seen that the angular positioning of the divots and lobes can be carefully positioned to correspond to the desired first (e.g., stow) and second (e.g., open) positions of the second member 45. Though the embodiment shown in FIGS. 13 and 14 has the lobes on the protrusions 47 of the second member 45, and the divots on the openings 48 of the first member 42, the pivots and openings, as well as the divots and lobes, can be interchanged in design between the first member 42 and second member 45.

FIGS. 15 and 16 show the coupling between the first member 42 and the second member 45 of the protective case 41. It can be seen that the protrusions on the inside walls of the second member 45 will couple with the openings on the lower portion 43 of the first member 42. As seen, and mentioned before, the first member 42 can be divided into different sections with multiple materials based upon localized functionality. The first member 42 comprises an elastomeric material in the area 43 that the second member 45 is attached to the first member 42. This allows for desirable functionality at the coupling point between the first member 42 and the second member 45. The upper portion 44 can be made with a hard shell, while the lower coupling portion 43 can be made with the elastomeric material for previously mentioned functionality purposes.

Figure 17:
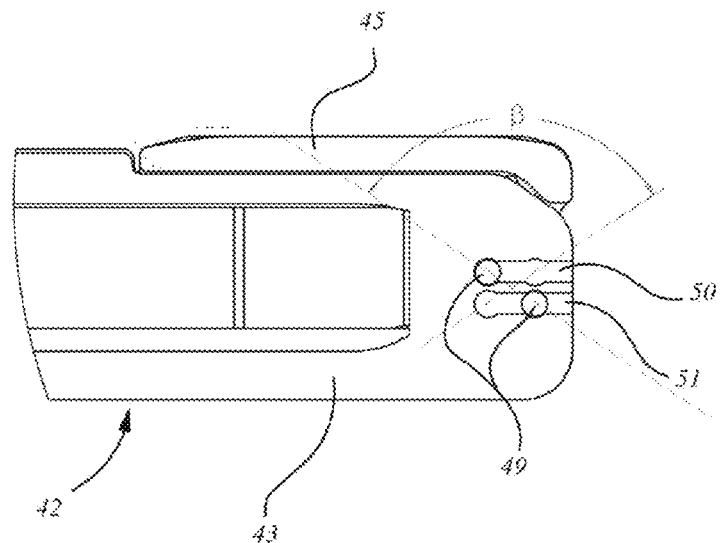
FIG. 17 is a side cross-sectional view of another embodiment of a protective case, showing an alternative coupling between the protective case first member and the repositionable sound deflecting second member, in the stowed position.
Figure 18:
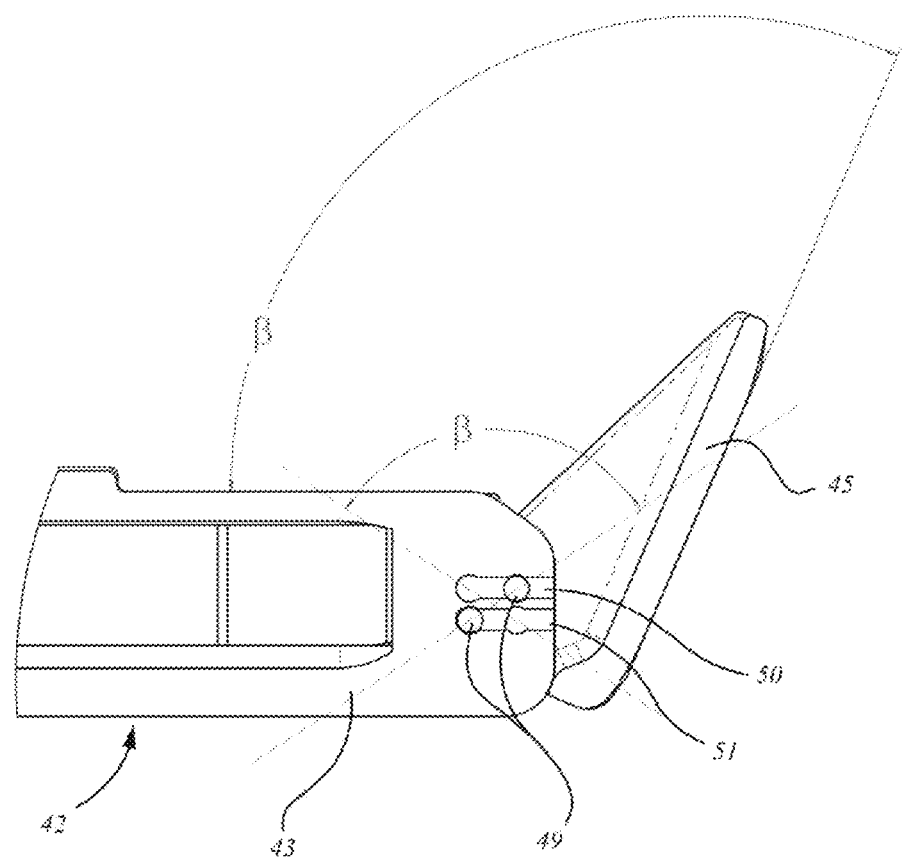
FIG. 18 is a side cross-sectional view of the protective case of FIG. 17, shown in the open second position.

FIGS. 17 and 18 show an alternative coupling between the first member 42 and the second member 45 of the protective case 41. In this embodiment, it can be seen that the second member 45 has pairs of protrusions 49 on each inner side wall of the second member 45 carefully position to engage with two grooves, an upper groove 50 and a lower groove 51, on lower portion 43 of the first member 42. Protrusions 49 provide two offset axes of rotations. The offset positioning of protrusions 49 allows the second member 45 to not only rotate but translate (e.g., slide) relative to the first member 42 and into the desired angular positions (e.g., stowed position, multiple open positions, etc.). For example, in the stowed position the bottom protrusion 49 in positioned in the right-most divet of lower groove 51. As second member 45 is rotated into the open position, lower protrusion 49 slides into the left-most divet of lower groove 51. The opposite is true of the upper protrusion 49 in upper groove 50. This rotating/translating coupler mechanism allows second member 45 to slide closer to first member 42 when in the open position, to achieve a more compact design and better sound redirection.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g., "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

Specific embodiments and applications of a sound enhancing protective case for electronic media devices have been disclosed. However, it should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A protective case for use with a portable electronic media device having a front wall with a visual display, a first side wall coupled with the front wall, a second side wall coupled with the front wall, a lower wall coupled with the front wall, an upper wall coupled with the front wall, a back wall opposite to that of the front wall, and an audio transducer disposed on at least one of the lower wall, the first side wall, the second side wall, the upper wall, and the back wall, wherein the audio transducer includes a radiating surface that vibrates during operation along a first vector, and wherein an intended viewing angle of the electronic device is substantially normal to the front wall, the protective case comprising:
   a first member configured to non-permanently attach to the portable electronic device, wherein the first member at least partially covers the first side wall and the second side wall of the portable sound emitting electronic device, and wherein the first member does not completely cover the screen; and
   a second member comprising at least one surface, the second member movably coupled with the first member in at least a first position and a second position, wherein the surface of the second member intercepts the vector and redirects the vector closer to the intended viewing angle when in the first position, and the surface of the second member avoids intercepting the vector when in the second position wherein the second member pivots about a fixed axis on the first member.

2. The protective case of claim 1, wherein the first member comprises an elastomeric material at the fixed axis.

3. The protective case of claim 1, wherein the first member has a rotatable coupling for receiving the second member, and wherein the rotatable coupling comprises an elastomeric material.

4. The protective case of claim 3, wherein the second member includes first and second protrusions along the fixed axis, and the first member includes first and second openings along the fixed axis, wherein at least one of the protrusions includes at least one lobe, and at least one of the openings includes complimenting divots, wherein the lobes and the divots nest together at specified angular positions of the second member.

5. The protective case of claim 1, wherein the first member comprises a hard material on an upper portion.

6. The protective case of claim 5, wherein the first member comprises an elastomeric material on a lower portion of the first member.

7. The protective case of claim 1, wherein the second member movably couples with the first member in a third position, wherein the third position redirects the vector closer to the intended viewing angle than the second position.

8. A protective case for use with a portable sound emitting electronic device having a front wall with a screen, a first side wall coupled with the front wall, a second side wall coupled with the front wall, a lower wall coupled with the front wall, an upper wall coupled with the front wall, and a back wall opposite to that of the front wall, wherein the sound emitting electronic device is configured to emit sound along a vector normal to at least one of the lower wall, the first side wall, the second side wall, the upper wall, and the back wall, and wherein an intended viewing angle of the sound emitting electronic device is mostly normal to the front wall, the protective case comprising:
   a first member configured to non-permanently attach to the sound emitting electronic device;
   wherein the first member at least partially covers the first side wall and the second side wall of the portable sound emitting electronic device and wherein, the first member does not completely cover the screen; and
   a second member comprising at least one surface, the second member being configured to attach to the first member in at least a first position and a second position, wherein the surface of the second member intercepts the vector and increases sound intensity at the intended viewing angle when in the first position, and the surface of the second member avoids intercepting the vector when in the second position wherein the second member pivots about a fixed axis on the first member.

9. The protective case of claim 8, wherein the first member comprises an elastomeric material in a lower portion that allows the second member to transition from the first position to the second position.

10. The protective case of claim 8, wherein the first member comprises an elastomeric material at the fixed axis.

11. The protective case of claim 10, wherein the second member includes two pivot bodies along the fixed axis, and the first member includes two pivot pockets along the fixed axis, wherein at least one of the pivot bodies includes at least one lobe, and at least one of the pivot pockets includes complimenting divots, wherein the lobes and the divots nest together at specified angular positions of the second member.

12. The protective case of claim 9, wherein the first member comprises a hard material on an upper portion of the first member.

13. The protective case of claim 10, wherein the second member pivots about a first axis and a second axis on the first member and wherein the first axis is offset from the second axis.

14. The protective case of claim 13, wherein the first axis and second axis slide relative to the first member.

* * * * *